(12) United States Patent
Grivna et al.

(10) Patent No.: US 7,256,119 B2
(45) Date of Patent: Aug. 14, 2007

(54) SEMICONDUCTOR DEVICE HAVING TRENCH STRUCTURES AND METHOD

(75) Inventors: Gordon M. Grivna, Mesa, AZ (US); Peter J. Zdebel, Austin, TX (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 123 days.

(21) Appl. No.: 11/132,949

(22) Filed: May 20, 2005

(65) Prior Publication Data

US 2006/0261444 A1    Nov. 23, 2006

(51) Int. Cl.
*H01L 21/4763* (2006.01)
(52) U.S. Cl. ............... 438/620; 438/666; 438/E21.537
(58) Field of Classification Search ........ 438/359–361, 438/430, 620–621, 639, 666–667; 257/E21.135, 257/E21.537
See application file for complete search history.

(56) References Cited

U.S. PATENT DOCUMENTS 4,927,775 A    5/1990  Alvarez et al.
6,955,972 B2 * 10/2005  Lee et al. ................... 438/430

OTHER PUBLICATIONS

"Silicon Processing for the VLSI Era, vol. 2: Process Integration," Stanley Wolf, Lattice Press, Copyright 1990, p. 542.

* cited by examiner

*Primary Examiner*—Hoai Pham
(74) *Attorney, Agent, or Firm*—Kevin B. Jackson

(57) ABSTRACT

In one embodiment, a pair of sidewall passivated trench contacts is formed in a substrate to provide electrical contact to a sub-surface feature. A doped region is diffused between the pair of sidewall passivated trenches to provide low resistance contacts.

20 Claims, 4 Drawing Sheets

SEMICONDUCTOR DEVICE HAVING TRENCH STRUCTURES AND METHOD

FIELD OF THE INVENTION

This invention relates, in general, to semiconductor device fabrication, and more particularly to structures and methods for forming multi-functional trenches.

BACKGROUND OF THE INVENTION

Many semiconductor devices require that contact regions be formed that electrically couple one surface of the device to a sub-surface feature or structure such as a buried layer or underlying substrate. When the sub-surface regions are deep within the substrate or an epitaxial layer (e.g., greater than about 10 microns), making the contact regions can be a challenge. Typically, manufacturers use very high energy ion implantation techniques and/or deep diffusions to drive dopants deep enough to make contact to the sub-surface feature. Alternatively, manufacturers use double diffusion techniques where a first region is implanted into a substrate, an epitaxial layer is then deposited, and a second region is implanted into the epitaxial layer above the first region. The two regions are then diffused together.

Deep high energy ion implants can be prohibitively expensive, and are technically unfeasible in some cases. Additionally, deep diffused regions including double diffused regions can adversely affect the size of a semiconductor device because the diffused dopants move or diffuse in all directions. Further, contact resistance associated with deep diffused mono-silicon layers can be quite high, which detrimentally impacts device performance.

In addition, as semiconductor devices evolve to include additional functionality on smaller chips, existing manufacturing processes are not flexible enough to support the additional functionality without significant increases in costs.

Accordingly, a structure and method of forming the structure are needed that provide a contact to a sub-surface feature or features, and that address the problems set forth above as well as others. Additionally, it would be advantageous for the structure to be usable for multiple purposes to save on costs.

DETAILED DESCRIPTION OF THE DRAWINGS

Figure 1:
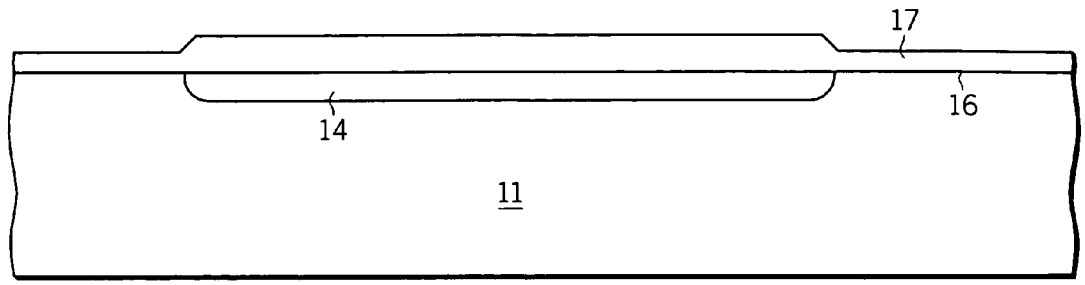
FIG. 1 illustrates a highly enlarged partial cross-sectional view of a structure in accordance with one embodiment of the present invention at an early stage of fabrication.

For ease of understanding, elements in the drawing figures are not necessarily drawn to scale, and like element numbers are used where appropriate throughout the various figures. Also, the terms first, second, third, fourth, and the like in the description and in the claims, if any, are used for distinguishing between similar elements and not necessarily for describing a sequential or chronological order. While the discussion below describes an embodiment with trench structures providing contacts to buried features (e.g., a buried layer and a substrate region), isolation, and diffusion shields, those skilled in the art will recognize that the present invention may be used to contact other buried features, to connect opposite sides of a substrate, and for other purposes.

FIG. 1 shows an enlarged partial cross-sectional view of a semiconductor device or cell 10 in accordance with the present invention at an early stage of fabrication. Device 10 includes a body of semiconductor material or semiconductor substrate 11. For example, semiconductor substrate comprises a silicon substrate of a first conductivity type (e.g., p-type), and has a doping concentration on the order of about $1.0\times10^{15}$ atoms/cm$^3$ about $1.0\times10^{16}$ atoms/cm$^3$. In an alternative embodiment, substrate 11 comprises a IV-IV compound semiconductor material (e.g., SiGe, SiGeC, or the like), a III-V, a II-VI, or a IV-VI semiconductor material.

In one embodiment, device 10 further includes a feature, buried layer, buried feature, device feature, sub-surface feature, sub-surface region, or region 14 of a second conductivity type (e.g., n-type) formed on, over, or within a major surface 16 of substrate 11. In one embodiment, region 14 is formed using conventional masking and doping techniques. Region 14 is diffused to a desired depth, using for example an anneal process at approximately 1100 degrees Celsius in dry oxygen. This step forms an oxide or dielectric layer 17 over major surface 16.

Figure 2:
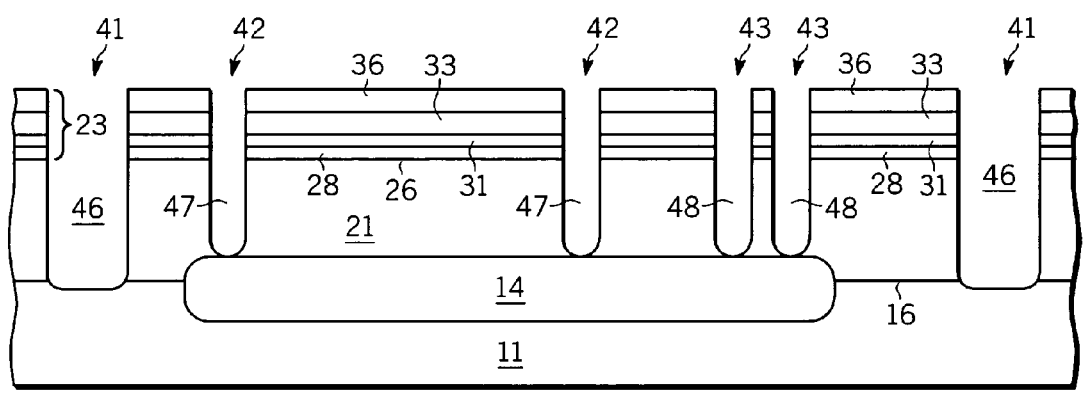
FIG. 2 illustrates a highly enlarged partial cross-sectional view of the structure of FIG. 1 at a subsequent stage of fabrication.

FIG. 2 shows a highly enlarged partial cross-sectional view of device 10 at a subsequent step in fabrication. Dielectric layer 17 is stripped, and a semiconductor layer or region or epitaxial layer 21 is formed over major surface 16. By way of example, semiconductor layer 21 comprises a layer of the second conductivity type, and has a lower doping concentration than region 14. For example, semiconductor layer 21 has a thickness on the order of about 10 microns or greater, and is formed using conventional epitaxial growth techniques.

Next, a dielectric stack, masking or hard mask structure 23 is formed over a major surface 26. By way of example, structure 23 includes a first dielectric layer 28 formed over, on or overlying major surface 26. In one embodiment, first dielectric layer 28 comprises about 0.04 to about 0.1 microns of silicon oxide. A polycrystalline silicon layer 31 is then formed or deposited over first dielectric layer 28, and comprises for example, about 0.025 to about 0.1 microns of undoped polysilicon. A second dielectric layer 33 is then formed or deposited over layer 31, and comprises for example, about 0.05 to about 0.2 microns of silicon nitride. Structure 23 further includes a third dielectric layer 36, which is formed or deposited over layer 33. By way of example, third dielectric layer 36 comprises a silicon oxide layer about 0.6 to about 1.0 microns thick.

After structure 23 is formed a photoresist layer (not shown) is deposited and patterned to provide openings 41, 42 and 43 over structure 23. By way of example, openings 41 are wider than openings 42 and 43, and have a width of about 1.0 to about 2.0 microns. Openings 41 are formed over a portion of device 10 that corresponds to a placement of a substrate contact structure in accordance with the present invention. By way of further example, openings 42 have a width of about 0.5 to about 1.5 microns, and are formed over another portion of device 10 that corresponds to a placement of a trench field shaping or isolation structure in accordance with the present invention. By way of still further example, openings 43 have a width of 0.5 to about 1.5 microns, and are formed over a further portion of device 10 that corresponds to a placement of a trench contact to a buried feature. After openings 41-43 are formed, structure 23 is etched using conventional techniques to expose portions of major surface 26. The phocoresist layer is then removed.

In accordance with the present invention trenches, channels, or holes 46, 47, and 48 then are etched through openings 41, 42 and 43 respectively into semiconductor layer 21. By way of example, trenches 46 are etched through semiconductor layer 21 to substrate 11. By way of further example, trenches 47 and 48 are etched through semiconductor layer 21 to touch, couple to, or contact buried layer or feature 14. Trenches 46, 47, 48 have depths that correspond to the thickness of semiconductor layer 21 and buried layer 14, and in one embodiment, have depths up to about 50 microns. In one embodiment, Deep Reactive Ion Etching (DRIE) etching with a fluorine or chlorine based chemistry is used to form trenches 46, 47, and 48. Several techniques are available for DRIE etching including cryogenic, high density plasma, or Bosch DRIE processing. In one embodiment where space considerations require tight spacing, trenches 46, 47 and/or 48 have substantially vertical sidewalls. In an another embodiment, trenches 46, 47 and/or 48 have a tapered profile where the width of the trench at the trench lower surface is less than the width adjacent major surface 26.

Figure 3:
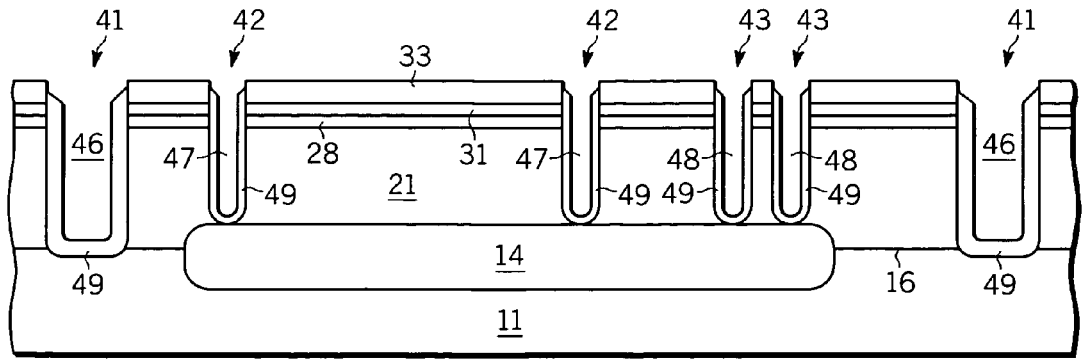
FIG. 3 illustrates a highly enlarged partial cross-sectional view of the structure of FIG. 1 at a further stage of fabrication.

FIG. 3 shows a highly enlarged partial cross-sectional view of device 10 at further stage of fabrication. At this step, third dielectric layer 36 is removed and a blocking layer, fourth dielectric layer or dielectric liner 49 is deposited or grown along exposed surfaces of trenches 46, 47, and 48. By way of example, fourth dielectric layer 49 comprises a thermal oxide having a thickness on the order of about 0.08 to about 0.1 microns thick. In alternative embodiment, fourth dielectric layer 49 comprises silicon nitride, an oxide/nitride multi-layer configuration, or another passivation material that, for example, inhibits the diffusion of semiconductor doping materials.

Figure 4:
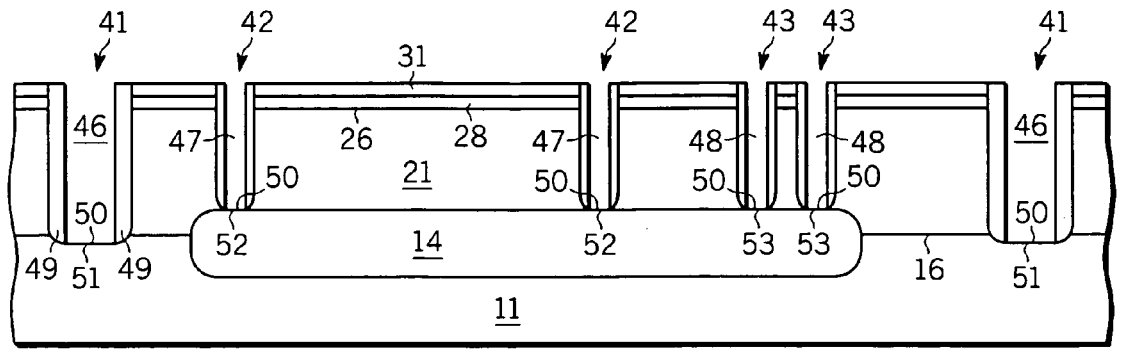
FIG. 4 illustrates a highly enlarged partial cross-sectional view of the structure of FIG. 1 at a still further stage of fabrication.

FIG. 4 shows a highly enlarged cross-sectional view of device 10 at a still further stage of fabrication. At this step, device 10 is exposed to an anisotropic dry etch step, which removes portions of dielectric liner 49 at the bottom or lower surfaces 51 of trenches 46 to expose a portion of substrate 11 or layer 21. Additionally, an aperture or opening 50 is formed in dielectric liner 49 at or along bottom or lower surfaces 52 of trenches 47 and at or along bottom or lower surfaces 53 of trenches 48 to expose portions of buried feature or layer 14 or layer 21. Additionally, during the dry etch step or a subsequent etch step, second dielectric layer 33 is removed. By way of example, a conventional dry etch with a fluorine or chlorine based chemistry is used to etch portions of dielectric liners 49.

Figure 5:
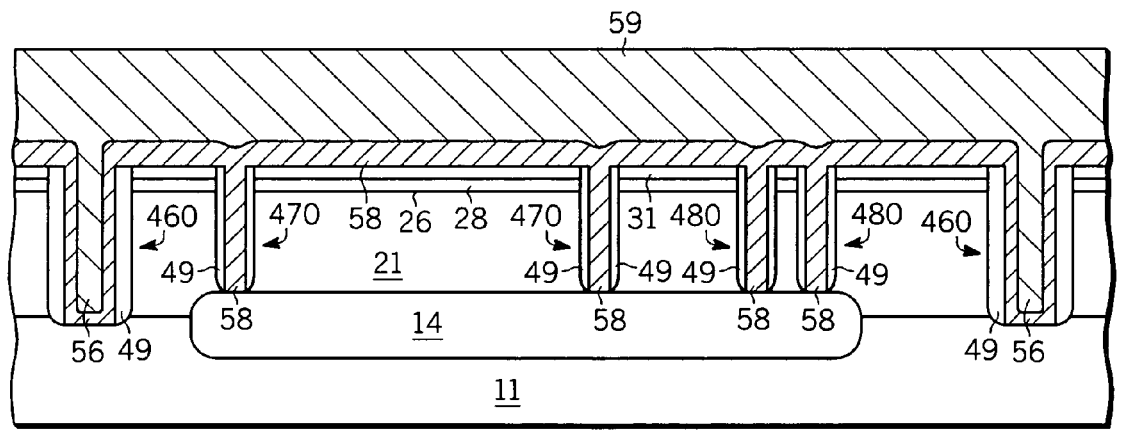
FIG. 5 illustrates a highly enlarged partial cross-sectional view of the structure of FIG. 1 after further processing.

FIG. 5 shows a highly enlarged cross-sectional view of device 10 after further processing. Specifically, trenches 46 are filled with a conductive material 56 to provide sidewall passivated deep trench contacts, passivated deep substrate contacts, passivated trench isolations regions, or trench contacts 460. Additionally, trenches 47 are filled with a material or conductive material 58 to provide sidewall passivated deep field shaping trench regions or trenches 470. Further, trenches 48 are filled with conductive material 58 to provide sidewall passivated deep trench contacts or structures 480.

By way of example, conductive materials 56 and 58 comprise a doped polycrystalline semiconductor material (e.g., doped polysilicon either n-type or p-type), a metal layer or plug (e.g., tungsten, aluminum, titanium, titanium nitride, or the like), a silicide, or combinations thereof.

In one embodiment and as shown in FIG. 5, conductive material 56 includes a layer of material 58 and a second conductive layer 59 formed overlying the layer of material 58. Because trenches 47 and 48 are narrower than trenches 46, only material 58 fills trenches 47 while both the layer of material 58 and second conductive layer 59 fill trenches 46. In this example, material 58 is deposited as undoped polysilicon having a thickness of about 0.2 to about 0.4 microns. Second conductive layer 59 comprises, for example, a doped polysilicon having the same conductivity type as substrate 11 (e.g. p-type in this example). At a subsequent step, masking and doping techniques are used to dope the polysilicon in trenches 47 and 48 with, for example, n-type dopant so that material 58 becomes conductive. Alternatively, masking techniques are used to mask either trenches 46 or 47 and 48 while the unmasked trench(es) is filled with doped polysilicon of a desired conductivity type. In a subsequent step, the other trenches are filled with doped polysilicon of another desired conductivity type. In accordance with the present invention, dielectric liners 49 mask, shield, or block dopant in conductive layers 58 and 59 from diffusing laterally from deep trench structures 460, 470 and 480. This provides for narrow and deep trench structures having multiple functions, and formed using a minimal amount of processing steps. In the embodiment shown, trenches 460 provide device isolation or substrate or ground plane low resistance trench structures, trenches 470 provide field shaping structures, and trenches 480 provide low resistance trench contacts to a buried feature such as buried layer 14.

Figure 6:
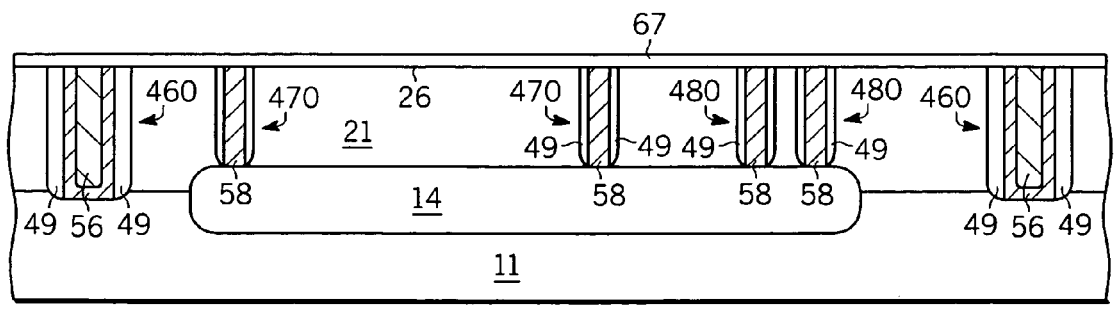
FIG. 6 illustrates a highly enlarged partial cross-sectional view of the structure of FIG. 1 after still further processing.

FIG. 6 shows a highly enlarged partial cross-sectional view of device 10 after still further processing. At this stage, conductive materials 56 and 58 are planarized or removed using chemical mechanical planarization or etch back techniques. Additionally, this step may be used to remove layer 31. First dielectric layer 28 is then stripped and another dielectric layer 67 is formed over major surface 26. By way of example, dielectric layer 67 comprises thermal oxide having a thickness of about 0.05 to about 0.1 microns.

Figure 7:
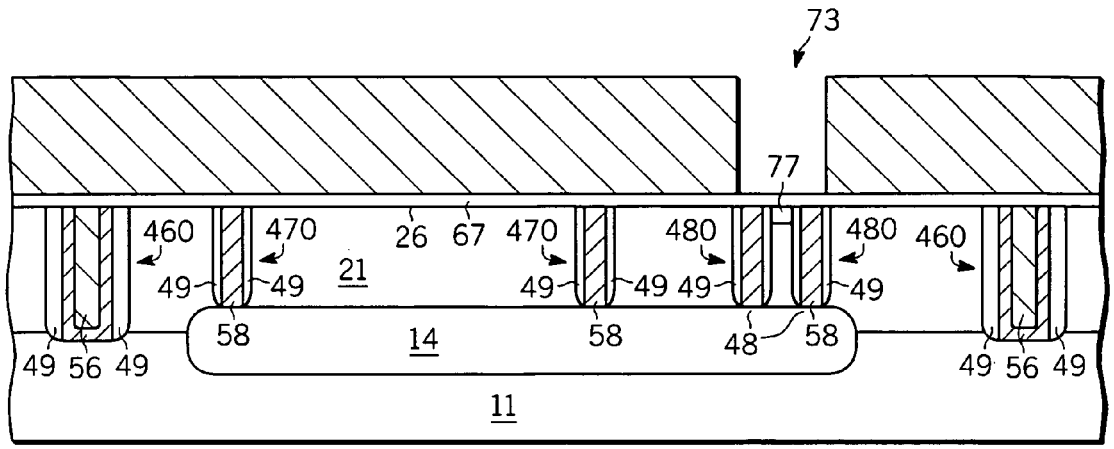
FIG. 7 illustrates a highly enlarged partial cross-sectional view of the structure of FIG. 1 after additional processing.

FIG. 7 shows a highly enlarged partial cross-sectional view of device 10 after additional processing and illustrates another feature of the present invention. At this step, a photoresist layer 71 is deposited over major surface 26 and patterned to form an opening 73 over a pair 481 of trench contacts 480. Next a dopant is introduced into an exposed portion of major surface 26 between pair 481 of trench contacts 430. By way of example, ion implantation is used to implant an n-type dopant into major surface 26 to form a doped region 77. In a subsequent step, device 10 is exposed to an elevated temperature and dopant in doped region 77 diffuses further into semiconductor layer 21. Pair 481 of trench contacts 480 are configured to provide or function as a diffusion shield or diffusion block so that lateral diffusion of dopant in doped region 77 is minimized. This feature reduces lateral diffusion of the dopant which provides a narrow highly doped diffused region.

Figure 8:
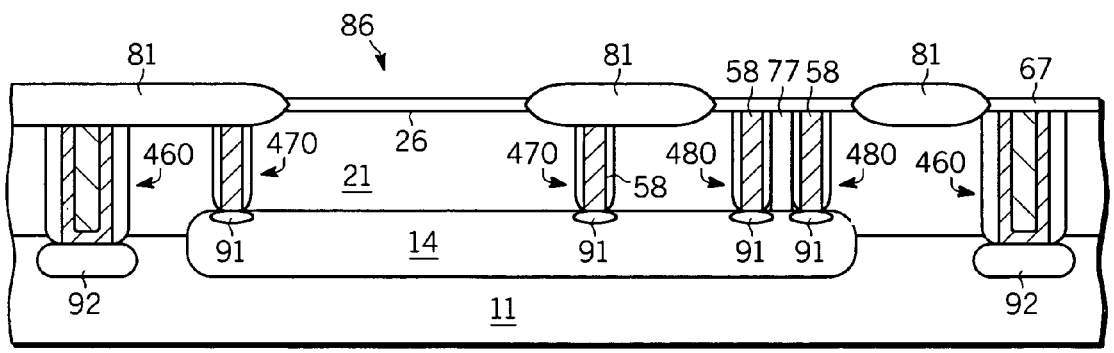
FIG. 8 illustrates a highly enlarged partial cross-sectional view of the structure of FIG. 1 at a subsequent step in fabrication.

FIG. 8 shows a highly enlarged partial cross-sectional view of device 10 at a subsequent step in fabrication. At this step, localized isolation regions 81 are formed on, overlying, over, or within major surface 26 to provide an isolated device active area 86. By way of example, isolation regions 81 comprise thermal oxide regions formed using conventional techniques such localized oxidation techniques. FIG. 8 further shows dopant diffused from conductive materials 56 and 58 into substrate 11 and buried layer 14. Additionally, doped region 77 is shown diffused to deeper or desired depth. In one embodiment, doped region 77 extends to buried layer 14. In alternative embodiment, doped region 77 is diffused only part way. Further, doped regions 91 are shown below trench structures 470 and 480, and are formed from dopants diffusing from conductive material 58 when conductive material 58 comprises doped polycrystalline semiconductor material. Doped regions 92 are shown below trench structures 460, and are formed from dopants diffusing from conductive material 56 when conductive material 56 comprises doped polycrystalline semiconductor material. In one embodiment, doped regions 92 and/or 91 comprise buried features, buried regions, sub-surface regions, or sub-surface features, which are contacted by sidewall passivated trench contacts 460 and 480 respectively. In subsequent steps, active devices such as transistor devices are formed in device active area 86 using conventional techniques. Trench structures 470 provide field shaping structures for the active devices, for example, devices having high breakdown voltage (e.g., >200 volts), which allows for closer spacing of devices.

Figure 9:
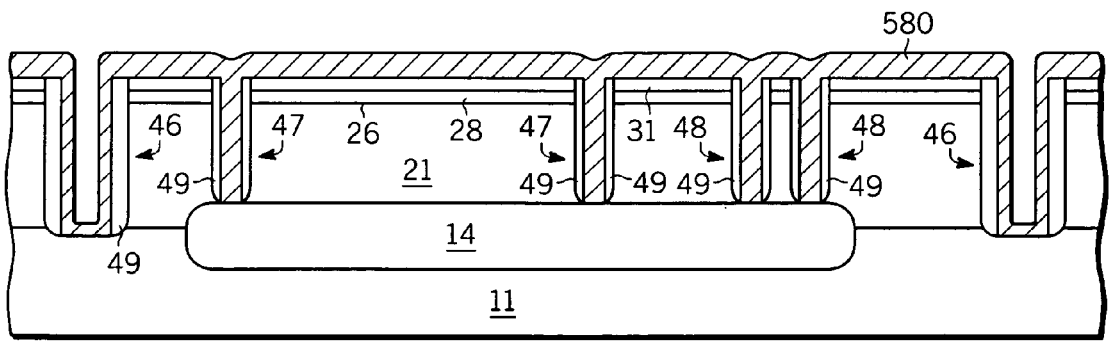
FIGS. 9-12 illustrate highly enlarged partial cross-sectional views of an alternative structure in accordance to the present invention at various stages of fabrication.

FIGS. 9-12 show highly enlarged partial cross-sectional views of an alternative method for forming trench structures 460, 470, and 480 in accordance with the present invention. FIG. 9 shows device 10 after the processing described up to about FIG. 4 has occurred. As shown in FIG. 9, a conductive material or layer 580 is formed or deposited overlying blocking layer 49 within trenches 46, 47, and 48. Because the width of trenches 47 and 48 is narrower or less than the width of trenches 46, trenches 47 and 48 fill or substantially fill-up, while only sidewall and lower surfaces of wider trenches 46 are covered. By way of example, conductive layer 580 comprises a doped polycrystalline material such as doped polysilicon. For example, conductive layer 580 comprises the same conductivity as buried feature 14. In an alternative embodiment, conductive material 580 comprises a metal layer (e.g., tungsten, aluminum, titanium, titanium nitride, or the like), a silicide, or combinations thereof.

Figure 10:
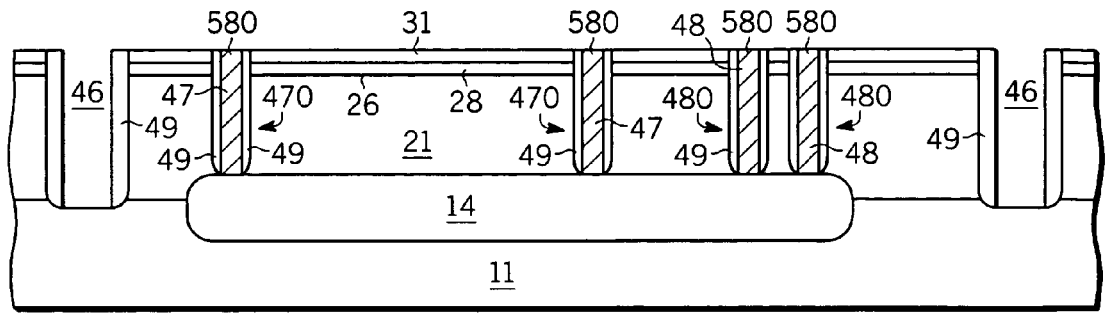
Figure 11:
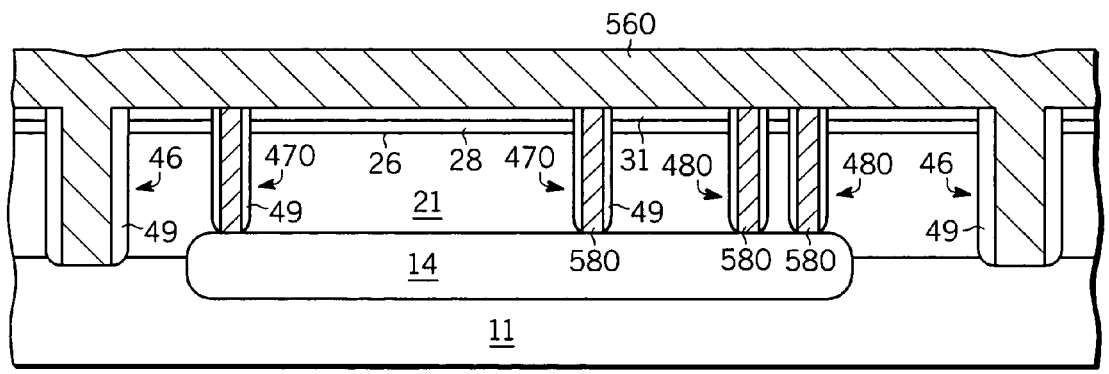
Figure 12:
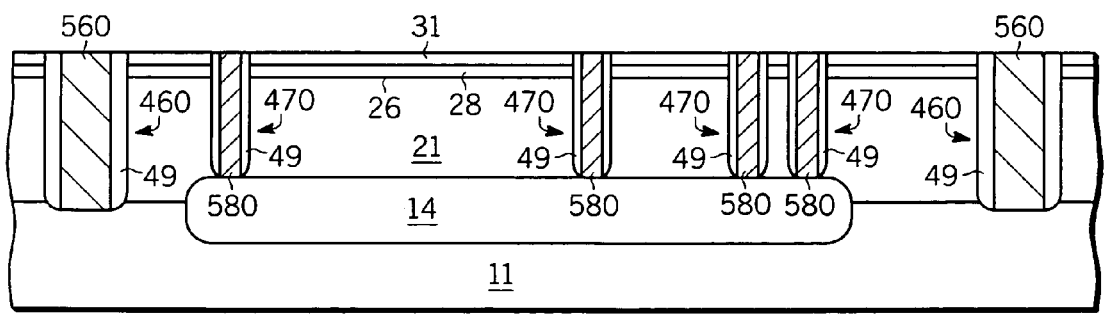

In a subsequent step, conductive material 580 may be removed using, for example, an isotropic or anisotropic etch step while leaving conductive material 580 in narrower trenches 47 and 48 as shown in FIG. 10. Next, conductive material or layer 560 is deposited or formed over device 10 and in trenches 46 as shown in FIG. 11. Any remaining conductive material 580 in trenches 46 can be counterdoped by layer 560 to achieve appropriate conductivity. By way of example, conductive material 560 comprises a doped polycrystalline semiconductor material. For example, conductive material 560 comprises a doped polysilicon, and has the same conductivity type as substrate 11. In an alternative embodiment, conductive material 560 comprises a metal layer (e.g., tungsten, aluminum, titanium, titanium nitride, or the like), a silicide, or combinations thereof. Conductive material 560 is then planarized to provide the structure shown in FIG. 12. Device 10 is then further processed in accordance for example, with the steps described in conjunction with FIGS. 6-8.

By now it should be appreciated that a structure and method has been provided for forming narrow and deep trenches having multiple functions. The structure and method reduce lateral diffusion problems associated with the prior art, and provide highly doped contacts, which reduces the contact resistance problems also associated with the prior art. In addition, the method provides trench field shaping regions, trench isolation regions, and trench substrate/ground plane contact regions using minimal processing steps.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method of forming a semiconductor device comprising the steps of:
    providing a substrate having a major surface and a sub-surface feature to be contacted;
    forming a first trench in the substrate and extending from the major surface;
    forming a second trench in the substrate and extending from the major surface;
    forming a blocking layer overlying exposed surfaces of the first and second trenches;
    forming a first conductive layer overlying the blocking layer in the first trench, wherein the first conductive layer is coupled to the sub-surface feature through a first opening in the blocking layer; and
    forming a second conductive layer overlying the blocking layer in the second trench, wherein the second conductive layer is coupled to the substrate through a second opening in the blocking layer.

2. The method of claim 1 further comprising the steps of:
    forming a third trench in the substrate and extending from the major surface;
    forming the blocking layer overlying exposed surfaces of the third trench; and
    forming the first conductive layer overlying the blocking layer in the third trench.

3. The method of claim 2 further comprising the step of forming an isolation region overlying the third trench.

4. The method of claim 2, wherein the step of forming the third trench includes forming the third trench in proximity to the first trench, the method further comprising the step of forming a doped region between the first and third trenches, wherein the first and third trenches form a diffusion shield to minimize lateral diffusion of the doped region.

5. The method of claim 4 wherein the step of forming the doped region includes forming the doped region to extend to the sub-surface feature.

6. The method of claim 1, wherein the step of forming the first conductive layer includes forming a doped polycrystalline semiconductor layer of a first conductivity type.

7. The method of claim 6, wherein the step of forming the second conductive layer comprises forming a doped polycrystalline semiconductor layer of a second conductivity type.

8. A method for forming a semiconductor device including the steps of:
   providing a semiconductor substrate having a major surface and a sub-surface feature;
   forming a first trench in the semiconductor substrate in proximity to the sub-surface feature;
   forming a second trench in the semiconductor substrate in proximity to the first trench;
   forming a first blocking layer overlying surfaces of the first trench;
   forming a second blocking layer overlying surfaces of the second trench;
   forming openings in the first and second blocking layers;
   forming a first conductive layer overlying the first and second blocking layers, wherein the first conductive layer is coupled to the sub-surface feature through the openings; and
   forming a doped region between the first and second trenches, wherein the first and second trenches form a diffusion shield to control lateral diffusion of the doped region.

9. The method of claim 8, wherein the step of forming the first conductive layer comprises forming a doped polycrystalline layer.

10. The method of claim 8, further comprising the steps of:
    forming a third trench in the semiconductor substrate;
    forming a third blocking layer overlying surfaces of the third trench;
    forming an opening in the third blocking layer; and
    forming a second conductive layer overlying the third blocking layer, wherein the second conductive layer is coupled to the semiconductor substrate through the opening.

11. The method of claim 10 wherein the step of forming the second conductive layer comprises a forming a doped polycrystalline semiconductor layer.

12. The method of claim 11 further comprising the step of diffusing dopant from the doped polycrystalline semiconductor layer into the semiconductor substrate.

13. The method of claim 8 further comprising the steps of:
    forming a third trench in the semiconductor substrate;
    forming a third blocking layer over surfaces of the third trench;
    forming the first conductive layer overlying the third blocking layer; and
    forming an isolation region over the third trench.

14. A process for forming a semiconductor device having a plurality of trenches including the steps or:
    providing a semiconductor substrate having a major surface and a sub-surface feature;
    forming the plurality of trenches including first and second trenches in the semiconductor substrate and extending from the major surface, wherein the first trench overlies the sub-surface feature and extends thereto, and wherein the second trench overlies another portion of the semiconductor substrate;
    forming a blocking layer overlying sidewall surfaces of the first and second trenches, wherein at least portions of lower surfaces of the first and second trenches are devoid of the blocking layer;
    forming a first polycrystalline semiconductor layer at least within the first and second trenches; and
    forming a second polycrystalline semiconductor layer within the second trench but not the first trench, wherein the second polycrystalline semiconductor layer is coupled to the semiconductor substrate within the second trench.

15. The process of claim 14 further comprising the step of removing the first polycrystalline semiconductor layer from the second trench before the step of forming the second polycrystalline semiconductor layer.

16. The process of claim 14, wherein the step of forming tue first polycrystalline semiconductor layer includes forming an undoped polycrystalline semiconductor layer, and wherein the step of forming the second polycrystalline semiconductor layer includes forming the second polycrystalline semiconductor layer wherein the second polycrystalline semiconductor layer and the semiconductor substrate are of the same conductivty type.

17. The process of claim 16 further comprising the step of selectively doping the first polycrystalline semiconductor layer in the first trench with a dopant having a conductivity type opposite to the conductivity type of the second polycrystalline semiconductor layer.

18. The process of claim 14, wherein the step of forming the second trench includes forming the second trench wider than the first trench.

19. The process of claim 14, wherein the step of providing the semiconductor substrate includes providing a semiconductor substrate of a first conductivity type, a semiconductor layer of a second conductivity type opposite to the first overlying the major surface of the semiconductor substrate, and the sub-surface feature of the second conductivity type.

20. The process of claim 14, wherein the step of forming the plurality of trenches includes forming a third trench adjacent the first trench and extending to the sub-surface feature, and wherein the step of forming the blocking layer includes forming the blocking layer at least on sidewall surfaces of the third trench, and wherein the step of forming the first polycrystalline semiconductor layer includes forming the first polycrystalline semiconductor layer within the third trench, and wherein the step of forming the second polycrystalline semiconductor layer includes forming the second polycrystalline semiconductor layer in the second trench but not in the third trench, and wherein the process further includes the step of forming a doped region between the first and third trenches, wherein the blocking layer is configured to reduce lateral diffusion of the first doped region between the first and third trenches.

* * * * *